(12) United States Patent
Phillips et al.

(10) Patent No.: US 10,289,007 B2
(45) Date of Patent: May 14, 2019

(54) LITHOGRAPHY TOOL HAVING A RETICLE STAGE CAPABLE OF DYNAMIC RETICLE BENDING TO COMPENSATE FOR DISTORTION

(71) Applicant: NIKON CORPORATION, Tokyo (JP)

(72) Inventors: Alton Phillips, Oro Valley, AZ (US); Yuichi Shibazaki, Kumagaya (JP)

(73) Assignee: NIKON CORPORATION (JP)

( * ) Notice: Subject to any disclaimer, the term of this patent is extended or adjusted under 35 U.S.C. 154(b) by 41 days.

(21) Appl. No.: 14/796,357

(22) Filed: Jul. 10, 2015

(65) Prior Publication Data
US 2016/0011525 A1    Jan. 14, 2016

Related U.S. Application Data

(60) Provisional application No. 62/023,139, filed on Jul. 10, 2014.

(51) Int. Cl.
*G03F 7/20* (2006.01)

(52) U.S. Cl.
CPC ............. *G03F 7/703* (2013.01); *G03F 7/707* (2013.01); *G03F 7/70783* (2013.01)

(58) Field of Classification Search
CPC ...... G03F 7/703; G03F 7/707; G03F 7/70741; G03F 7/70783
See application file for complete search history.

(56) References Cited

U.S. PATENT DOCUMENTS

| | | | | |
|---|---|---|---|---|
| 6,172,738 B1* | 1/2001 | Korenaga | ........... | G03F 7/70358 250/206 |
| 6,469,773 B1* | 10/2002 | Iwamoto | ............. | G03F 7/70358 355/53 |
| 6,806,943 B2* | 10/2004 | Barringer | ................ | G03F 7/707 355/72 |
| 7,394,526 B2* | 7/2008 | Shibazaki | ............... | G03F 7/707 355/72 |
| 7,459,701 B2* | 12/2008 | Baggen | .................... | G03F 7/707 250/491.1 |
| 7,675,607 B2 | 3/2010 | Jeunink et al. | | |
| 2005/0134829 A1* | 6/2005 | Ottens | ...................... | G03F 7/707 355/75 |
| 2006/0082756 A1* | 4/2006 | Phillips | .................. | G03B 27/58 355/75 |
| 2007/0182947 A1* | 8/2007 | Hempenius | ............. | G03F 7/707 355/75 |
| 2007/0188724 A1* | 8/2007 | Jacobs | ................ | G03F 7/70358 355/53 |
| 2008/0013068 A1* | 1/2008 | Jeunink | .................... | G03F 7/707 355/75 |
| 2010/0097588 A1 | 4/2010 | Phillips et al. | | |
| 2012/0140198 A1* | 6/2012 | Amin-Shahidi | ........ | G03F 7/707 355/72 |
| 2013/0250271 A1 | 9/2013 | Phillips et al. | | |

(Continued)

FOREIGN PATENT DOCUMENTS

JP    2012-058391    3/2012

*Primary Examiner* — Deoram Persaud
(74) *Attorney, Agent, or Firm* — Roeder & Broder LLP; Steven G. Roeder

(57) ABSTRACT

A scanning lithography tool that includes a reticle stage for clamping and imparting a bending moment onto a reticle by applying a force along a plane surface of the reticle to bend the reticle in a deterministic manner.

30 Claims, 8 Drawing Sheets

(56) References Cited

U.S. PATENT DOCUMENTS

2015/0220005 A1\* 8/2015 Ward .................. G03F 7/24
355/55
2015/0277241 A1\* 10/2015 Valentin ............. G03F 7/707
355/72
2016/0186305 A1\* 6/2016 Han .................. C23C 14/042
118/623
2016/0186317 A1\* 6/2016 Han .................. C23C 14/042
29/464

\* cited by examiner

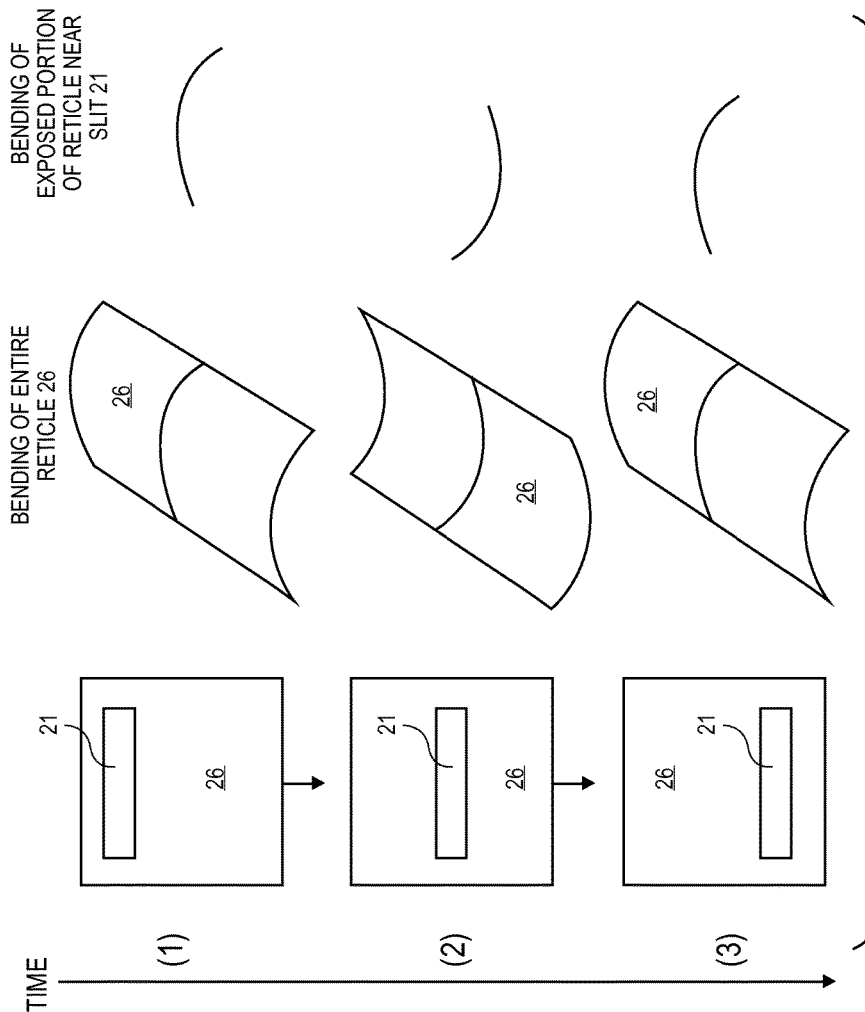

LITHOGRAPHY TOOL HAVING A RETICLE STAGE CAPABLE OF DYNAMIC RETICLE BENDING TO COMPENSATE FOR DISTORTION

RELATED APPLICATION

This application claims priority on U.S. Provisional Application Ser. No. 62/023,139 filed on Jul. 10, 2014, and entitled "LITHOGRAPHY TOOL HAVING A RETICLE STAGE CAPABLE OF DYNAMIC RETICLE BENDING TO COMPENSATE FOR DISTORTION". As far as permitted, the contents of U.S. Provisional Application Ser. No. 62/023,139 are incorporated herein by reference.

BACKGROUND

This invention relates to lithography tools used for patterning substrates, and more particularly, to a lithography tool having a reticle stage capable of dynamically bending a reticle in a deterministic manner during scanning for the purpose of correcting unwanted distortion of the reticle and/or the projection optics of the tool.

DESCRIPTION OF RELATED ART

Lithography tools are used to transfer a pattern defined by a reticle onto a substrate. A typical lithography tool includes an illumination source, a projection lens assembly, a reticle stage for holding and positioning the reticle, a substrate stage that holds and positions the substrate relative to the projection lens assembly, and a metrology system that precisely monitors the positions of the reticle and the substrate relative to one another. One type of well-known lithography tool is commonly referred to as a scanner.

With scanners, the reticle is scanned in one direction while the substrate is scanned, depending on the implementation, in either the opposite or the same direction. During the two scanning motions, light from the illumination source is passed through an exposure slit and the reticle and projected by the projection lens assembly onto the substrate. As a result, the pattern defined by the reticle is exposed onto a portion of the substrate. Once a scan is complete, the substrate is stepped, and then another scan is performed. This process is repeated until all the desired portions of the substrate are patterned.

A number of problems are associated with current reticle stage designs. During scanning operations, both the reticle and the down-stream optics of the projection lens assembly are subject to intense heat from the illumination source. This intense heat often causes both the reticle and the down-stream optics to distort, resulting in printing and/or overlay errors. Also the reticle itself is not perfectly flat. When the reticle is clamped to the reticle chuck that is also not perfectly flat, further unwanted reticle distortion may be introduced. In addition, often in the fabrication of substrates, different reticles are used in the lithography tool. Each reticle will typically vary and each will typically have different imperfections, resulting in different distortion patterns. Consequently, the use of different reticles makes compensation very difficult, since the distortion introduced by each reticle varies in a non-deterministic manner.

One known attempt to compensate for reticle distortion is provided in U.S. Pat. No. 7,675,607. With this approach, a support clamp, separate from a reticle chuck used to chuck and position the reticle, is provided on the top surface of the reticle. In addition, actuators, such as force bellows, are provided on the peripheral side edges of the reticle. By controlling the actuators while the reticle is held in place by the support clamp, the reticle can be bent in a controlled manner by creating a force that is normal or perpendicular to a plane surface of the reticle. In response to the perpendicular force, the reticle bends and compensates for distortion introduced by the reticle and down-stream optics. The problem with this approach, however, is that it is overly complicated and expensive to implement since the support clamp and actuators need be provided on the reticle stage.

Another known attempt to compensate for the reticle and/or down-stream optics distortion is to purposely bend the reticle as described in U.S. application Ser. No. 13/768,211 (now U.S. Publication 2013/0250271), assigned to the assignee of the present application. With this known reticle bending solution, the reticle is held in place on the reticle stage by a "soft" vacuum membrane-chuck. With the soft vacuum membrane-chuck, the reticle is allowed to conform when chucked, which reduces some degree of distortion caused by the non-flatness of the reticle and membrane-chuck. By selectively controlling the relative vacuum in regions above and below the membrane-chuck, the reticle can be purposely bent (i.e., bowed), resulting in at least a partial correction of the distortion caused by the reticle and/or down-stream optics. In addition, the aforementioned regions may be used to purposely create high and/or low pressure zones adjacent the reticle and under the membrane-chuck. By selectively controlling the pressure in these zones, some degree of localized bending of the reticle can be achieved, providing a higher degree of distortion correction.

Although the above-described reticle bending approach is advantageous, it has at least one limitation. In the regions where the vacuum pressure is reduced to induce bending, there is a proportional reduction in the grip between the reticle and the chuck. As a result, the reticle is prone to slippage when the reticle stage is accelerated during scanning and/or stepping. When slippage occurs, overlay and printing errors typically result. As the specifications for acceleration become faster and more demanding with future generation lithography tools, a solution that provides localized bending of the reticle and high-grip reticle chucking will be needed.

SUMMARY

A scanning lithography tool that includes a reticle stage that provides reticle bending to compensate for optical distortion and high-grip sufficient to prevent slippage even at high-accelerations is described. The tool includes a reticle chuck that clamps the reticle and imparts a bending moment to the reticle. The bending moment is generated by applying a force, along a plane surface of the reticle, to bend the reticle in a deterministic manner. In a non-exclusive embodiment, the force is generated by chucking opposing sides of the reticle to first and second reticle chuck bodies respectively. By moving the first and the second reticle chuck bodies relative to one another, the force that imparts the bending moment is created. Thus, by controlling relative movement of the first and second reticle chuck bodies during scanning, localized, deterministic, upward and/or downward, bending of the reticle adjacent the stationary exposure slit can be achieved during the scan. In addition, the high-grip chucking is achieved by chucking the reticle using compliant blade-chucks within a vacuum seal. Since the blade-chucks are compliant, distortion created by non-flat reticles is reduced. In addition by controlling the negative pressure within the vacuum seal, a grip sufficient to prevent slippage, even at high-accelerations, is achieved.

BRIEF DESCRIPTION OF THE DRAWINGS

The invention may best be understood by reference to the following description taken in conjunction with the accompanying drawings, which illustrate specific embodiments of the invention.

FIGS. 4A and 4B illustrate dynamic reticle bending created by the reticle stage of the present invention during a scan.

DETAILED DESCRIPTION OF SPECIFIC EMBODIMENTS

The invention will now be described in detail with reference to various embodiments thereof as illustrated in the accompanying drawings. In the following description, specific details are set forth in order to provide a thorough understanding of the invention. It will be apparent, however, to one skilled in the art, that the invention may be practiced without using some of the implementation details set forth herein. It should also be understood that well known operations have not been described in detail in order to not unnecessarily obscure the invention.

Figure 1:
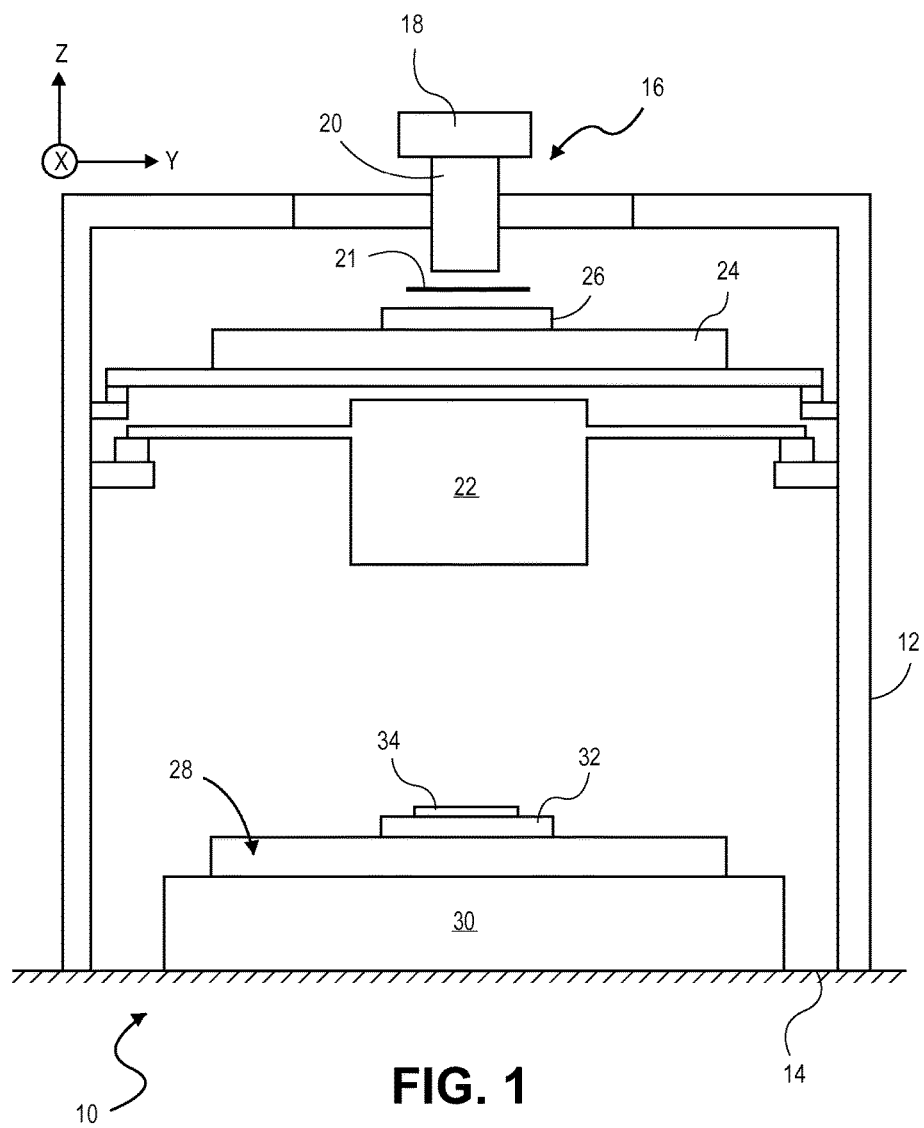
FIG. 1 is a block diagram of a non-exclusive embodiment of a lithography tool in accordance with the principles of the present invention.

Referring to FIG. 1, a schematic of a non-exclusive embodiment of a scanning type lithography tool 10 embodying the principles of the present invention is shown. The lithography tool 10 includes a frame 12 mechanically coupled to ground 14, an illumination assembly 16 including an illumination source 18 and illumination optical assembly 20, a stationary exposure slit 21, a projection lens assembly 22, a reticle stage 24 for supporting and moving a reticle 26, and a substrate stage 28, including a counter-mass 30 and a substrate holder 32, for supporting and moving a substrate 34 to be patterned. The illumination assembly 16, projection lens assembly 22, and reticle stage 24 are each mechanically coupled to the frame 12. In addition, the counter-mass 30 of the substrate stage 28 is also mechanically coupled to ground 14.

During scanning, light from the illumination source 18 and optical assembly 20 is passed through the stationary exposure slit 21, while the reticle 26 and the substrate 34 move synchronously (i.e., are "scanned"), according to different embodiments, in either the same direction or opposing directions with respect to one another. As a result, a portion of the substrate 34 is exposed and imaged by the pattern defined by the reticle 26. After the scan is complete, the substrate 34 is stepped by the substrate stage 28 relative to reticle 26, and then another scan is performed. This scanning and stepping process is repeated until all the desired portions of the substrate 34 are patterned.

In various embodiments, the tool 10 may also be either a conventional "dry" lithography tool or an immersion lithography tool. With immersion tools, an immersion nozzle (not illustrated) is provided to contain an immersion liquid over the substrate 34 during exposures. In further embodiments, illumination source 18 generates light having wavelengths of 248, 193 or 157 nanometers. In yet other embodiments, the illumination source 18 may generate light waves having larger or smaller wavelengths. In addition, the illumination optical assembly 20 may be optional. In tools 10 without illumination optical assembly 20, the reticle 26 receives light waves directly from the illumination source 18. In yet additional embodiments, substrate 34 may be a semiconductor wafer, a flat panel display, or any other type of work-piece.

In the embodiment illustrated in FIG. 1, the reticle stage 24 is a one stage design, meaning a single stage is used to move and position the reticle in up to six degrees of freedom (X, Y, Z, θX, θY, and θZ). In an alternative embodiment (not illustrated), the reticle stage 24 is a two-stage design, including a fine stage and a coarse stage. With the latter, the coarse stage is responsible for long stroke movements of the reticle 26 in the X and/or Y directions, while the fine stage is responsible for fine positioning of the reticle 26 in up to all six degrees of freedom.

Also in the embodiment illustrated in FIG. 1, the substrate stage 28 is also a one stage design, meaning a single stage is responsible for moving and positioning the substrate 34 in up to six degrees of freedom. In an alternative embodiment (not illustrated), the substrate stage 28 may be a two-stage design, including a fine stage and a coarse stage. With the latter, the coarse stage is responsible for long stroke movements of the substrate 34 in the X and/or Y directions, while the fine stage is responsible for fine positioning of the substrate 34 in up to all six degrees of freedom.

Figure 2:
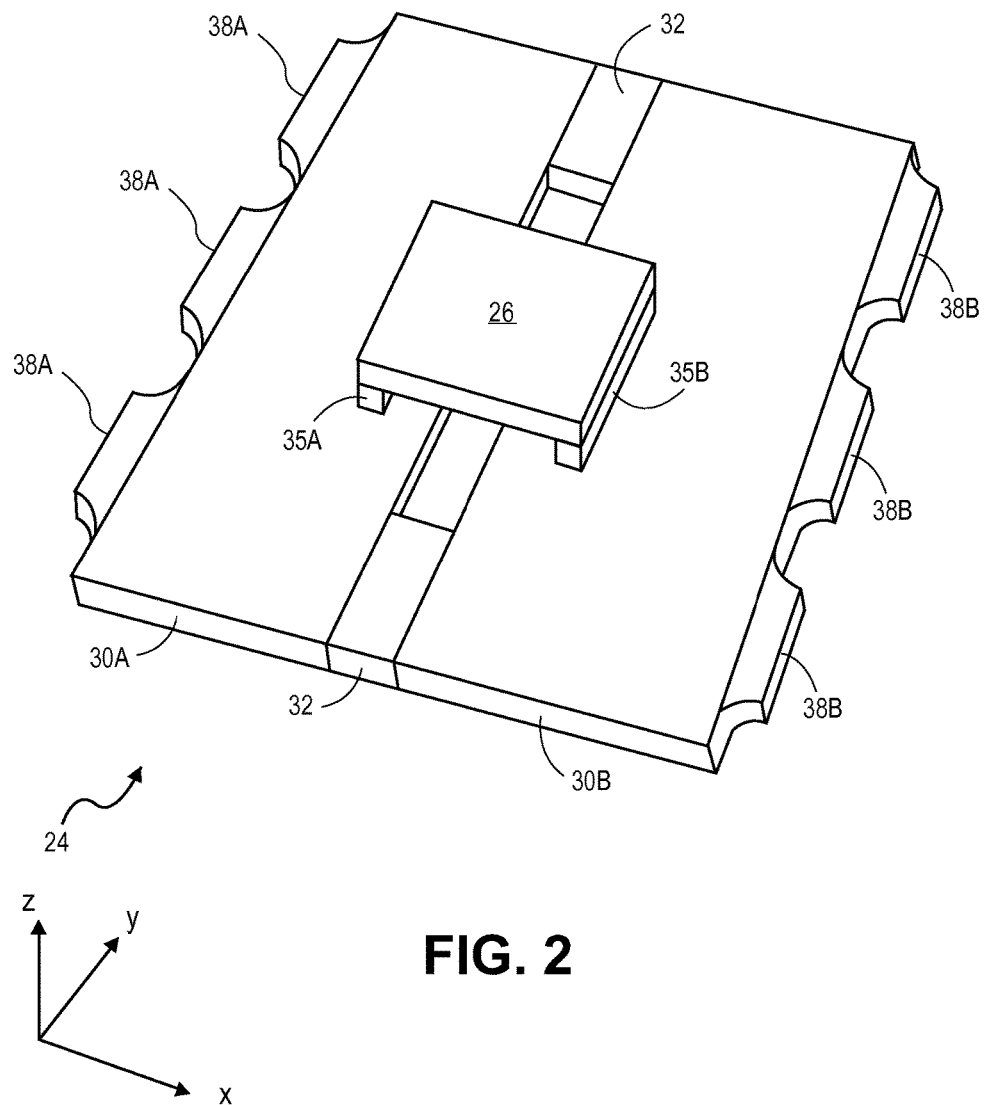
FIG. 2 is a perspective view of a non-exclusive embodiment of a reticle stage of the lithography tool of the present invention.

Referring to FIG. 2, a perspective view of a non-exclusive embodiment of a reticle stage 24 is illustrated. The reticle stage 24 includes a first reticle stage body 30A, and a second reticle stage body 30B. Flexures 32 are provided between the first and second reticle stage bodies 30A and 30B in the Y direction. A first reticle clamping element 35A and a second reticle clamping element are 35B are provided on the first reticle stage body 30A and the second reticle stage body 30B respectively. A first set of motors 38A are responsible for moving the first reticle stage body 30A. A second set of motors 38B are responsible for moving the second reticle stage body 30B. In various embodiments, the motors 38A and 38B may be capable of moving first and second reticle stage bodies 30A and 30B each in X, Y, Z, θX, θY, and θZ directions. Accordingly, by controlling the motors 38A and 38B, the first reticle stage body 30A and the second reticle stage body 30B may (i) each independently be moved in up to six degrees of freedom and (ii) be moved relative to one another. It should be noted that the flexures 32 are optional. In embodiments where no flexures 32 are used, the first reticle stage body 30A and the second reticle stage body 30B may be independently moved in up to six degrees of freedom since the bodies are not mechanically connected or coupled to one another.

Figure 3:
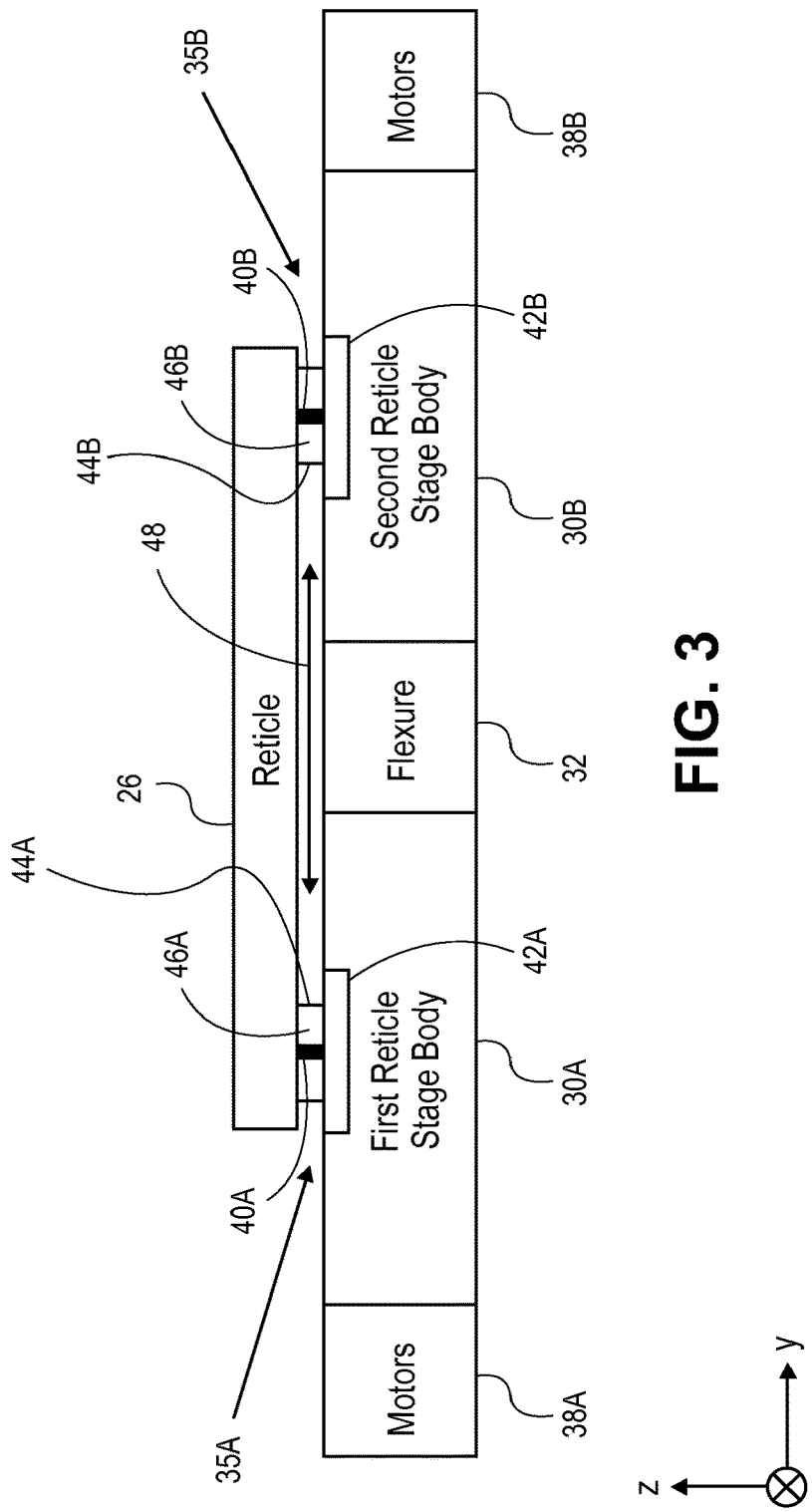
FIG. 3 is a cross-section view of the reticle stage used in the lithography tool of the present invention.

Referring to FIG. 3, a cross-section view of a first reticle clamping element 35A and a second reticle clamping element 35B that are clamping a reticle 26 to the first and second reticle stage bodies 30A and 30B respectively is illustrated. The first and second reticle clamping elements 35A and 35B include blade-chucks 40A and 40B respectively. The blade-chucks 40A and 40B are provided between the bottom surface of the reticle 26 and flexible elements 42A and 42B, each embedded in or attached to the first and second reticle stage bodies 30A and 30B respectively. In addition, vacuum seals 44A and 44B are provided around the blade-chucks 40A and 40B respectively. By maintaining a vacuum within the seals 44A and 44B, vacuum regions 46A and 46B are created, chucking the reticle 26 to the blade-chucks 40A and 40B respectively. With the flexible elements 42A and 42B, the blade-chucks 40A and 40B each comply with the topography of the bottom surface of the reticle 26, which reduces distortion otherwise caused by chucking a non-flat reticle 26 to a non-flat chuck. In addition, by controlling the pressure in the vacuum regions 46A and 46B, the gripping force applied to the reticle 26 may be controlled. Thus by creating a sufficient negative pressure, a gripping force may be created to prevent slippage, even during high g-acceleration of the reticle stage 24, as required in future lithography tools.

When the reticle stage bodies 30A and 30B are moved relative to one another, a force (designated by arrow 48) is applied along a plane surface (e.g., the bottom surface) of the reticle 26. This force 48 imparts a bending moment to the reticle 26. Thus, by controlling the motors 38A and/or 38B, the force 48 applied along the plane surface of the reticle 26, and the resulting bending moment, can be dynamically controlled during scanning. Consequently, deterministic bending of the reticle 26, along the scan direction, can be achieved by dynamically controlling the relative movements of the reticle stage bodies 30A and 30B respectively. For example, when the reticle stage bodies 30A and 30B are moved closer to one another, it results in the upward bending of the reticle 26. Conversely when the reticle stage bodies 30A and 30B are moved away from one another, downward bending of the reticle 26 results. Thus, localized, deterministic, bending (i.e., both upward and downward) of the reticle 26 can be achieved during scanning by controlling the relative movement of the reticle stage bodies 30A and 30B during the scan.

Referring to FIG. 4A, the dynamic reticle bending during a scan is illustrated. In this example, the reticle 26 relative to the stationary projection slit 21 is shown at the beginning of a scan (Time 1), the middle of a scan (Time 2) and the end of a scan (Time 3).

Time 1: The reticle stage bodies 30A and 30B are moved closer to one another. As a result, the moment causes the reticle 24 to be shaped or bent upward. Consequently, the portion of the reticle that is being exposed, adjacent the slit 21, is bent upward.

Time 2: The reticle stage bodies 30A and 30B are moved apart from one another. As a result, the moment causes the reticle 24 to be shaped or bent downward. Consequently, the portion of the reticle 26 that is being exposed, adjacent the slit 21, is bent down.

Time 3: The reticle stage bodies 30A and 30B are moved closer to one another. As a result, the moment causes the reticle 24 to be shaped or bent upward. Consequently, the portion of the reticle that is being exposed, adjacent the slit 21, is bent upward.

Consequently, as illustrated in FIG. 4B, localized, deterministic bending (i.e., both upward and downward) of the reticle 26 during a scan is achieved, depending on the relative movement of the reticle stage bodies 30A and 30B respectively.

With many lithography tools, the reticle stage is accelerated in the Y direction prior to scanning. Once the reticle stage reaches a desired scanning speed, the scanning of the reticle stage and substrate stage may begin. During acceleration, however, the reticle will often rotate about the X axis. For example, when a reticle is supported below its center of gravity, the leading edge of the reticle will tend to contract and bend upward, while the trailing edge of the reticle tends to expand and bend downward. When the reticle is supported above the center of gravity, bending in the opposite directions tend to occur. Regardless of the direction, slippage of the reticle may occur during acceleration due to the expanding and contracting of the reticle.

Figure 4C:
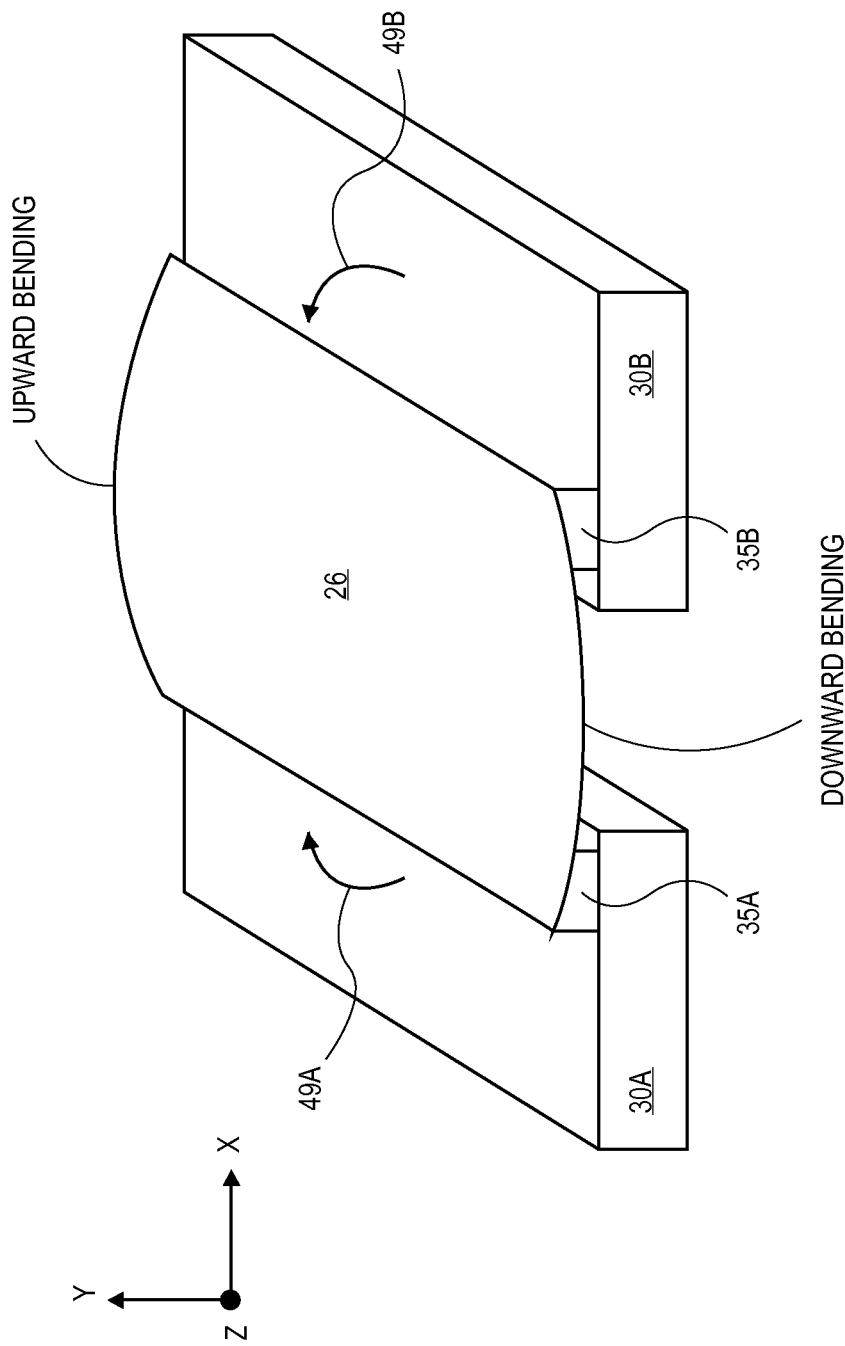
FIG. 4C illustrates dynamic reticle bending to prevent slippage during pre-scanning acceleration of the reticle stage in accordance with another non-exclusive embodiment.

Referring to FIG. 4C, a diagram illustrating dynamic reticle bending to prevent slippage during acceleration of the reticle stage is shown. In this non-exclusive embodiment, the leading portions of the first reticle stage body 30A and the second reticle stage body 30B are rotated inward, while the trailing portions are rotated outward, as designated by the arrows 49A and 49B, during acceleration in the Y direction. As a result, a force is created and dynamically applied along the plane surface of the reticle 26 during the acceleration. This force complements the inherent leading-edge contraction and trailing-edge expansion of the reticle 26 during acceleration as noted above. As a result, the contact interface between the reticle 26 and the reticle clamping elements 35A and 35B thus remain largely intact, reducing or altogether eliminating slippage.

It should be noted that the embodiment shown in FIG. 4C is merely illustrative. The reticle 26 may be deterministically bent in any desired manner to reduce or eliminate slippage during acceleration. For example, with reticles that are supported above their center of gravity, the reticle 26 may be deterministically bent in a manner opposite to that described above to reduce or eliminate slippage.

It also should be noted that with future lithography tools, it is possible that scanning will occur during acceleration. Accordingly, in yet another embodiment, the aforementioned dynamic reticle bending technique may also be used when scanning during acceleration.

Figure 5:
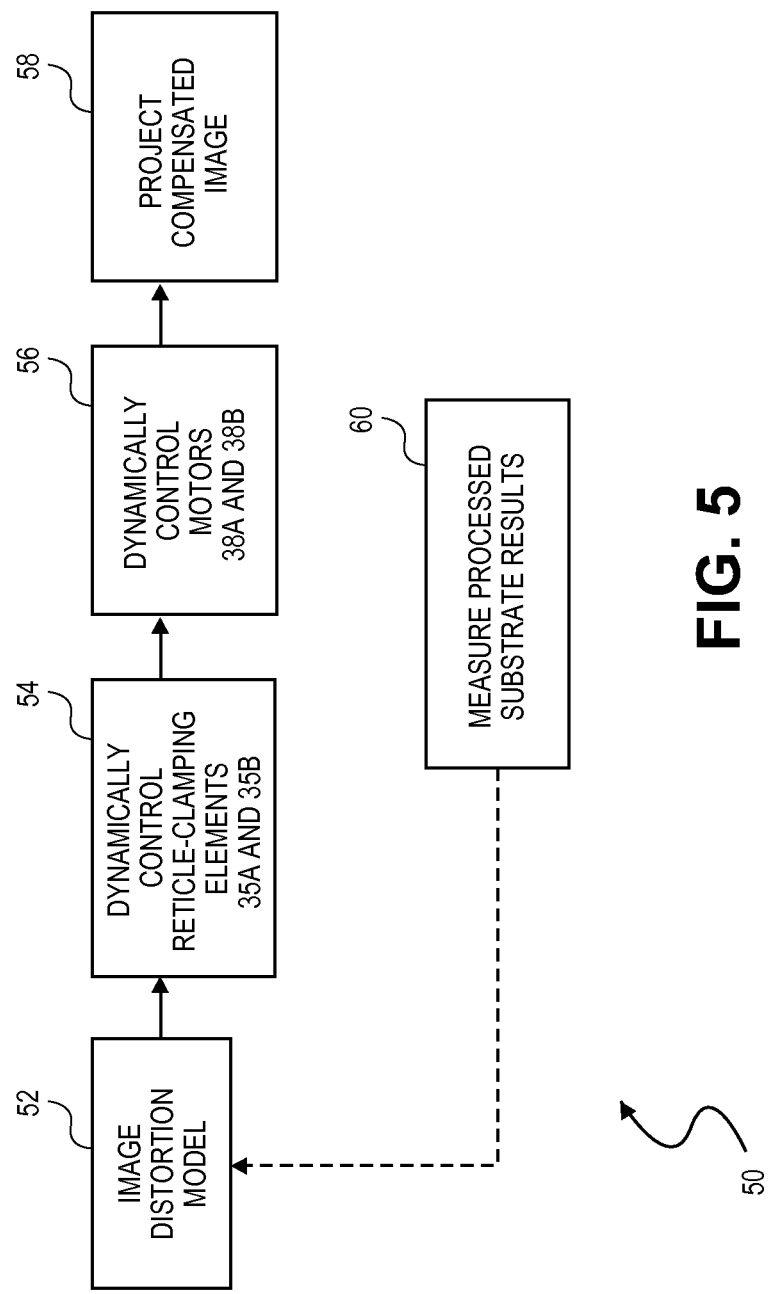
FIG. 5 is a flow diagram illustrating the steps for generating and using image distortion model during the operation of the lithography tool in accordance with a non-exclusive embodiment of the invention.

Referring to FIG. 5, a flow diagram 50 illustrating the steps for generating and using an image distortion model during the operation of the lithography tool 10 in accordance with a non-exclusive embodiment is shown. In this embodiment, an image distortion model is created (step 52) by one or more of the following (i) measuring distortion across the reticle, (ii) measuring the distortion of the down-stream optics of the projection lens assembly 22, and (iii) measuring the results of processed substrates 34. Once the distortion model is generated, then control signals are provided to dynamically control the reticle clamping elements 35A and 35B (step 54) and/or the motors 38A/38B (step 56). With both the steps 54 and 56, localized, dynamic, bending of the reticle 26 in either the up or down directions is performed, as necessary, to compensate for both the distortion of the reticle 26 and the down-stream optics of the projection lens assembly 22. In step 58, the compensated image defined by the reticle 26 is imaged onto the substrate 34 during scanning. In a final step 60, processed substrates 34 are periodically inspected and the image distortion model 52 is updated, when appropriate, based on the inspection results. By relying on such an image distortion model, deterministic bending of the reticle may be achieved. By deterministic, the applicant intends to mean that the reticle 26 may be predictably bent in the same manner over the course of a scan, from scan-to-scan, without the need for feedback, until the distortion model is updated.

Figure 6A:
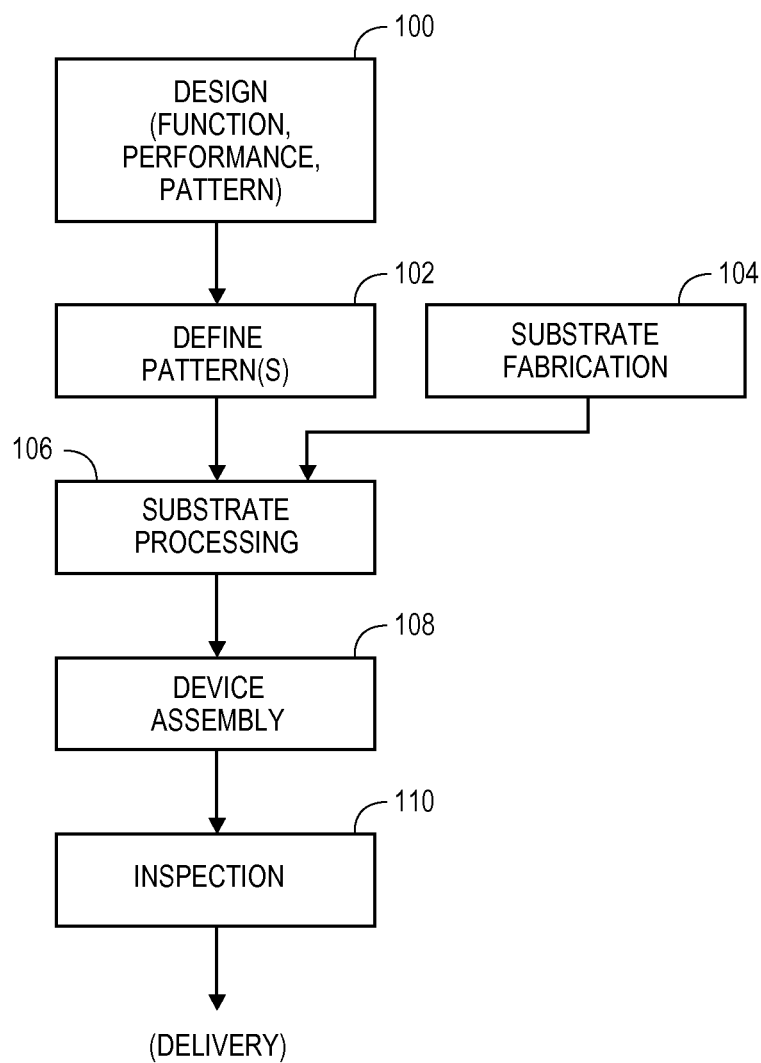
FIGS. 6A and 6B are flow diagrams illustrating the operation of the lithography tool in accordance with a non-exclusive embodiment of the invention The above-listed figures are illustrative and are provided as merely examples of embodiments for implementing the various principles and features of the present invention. It should be understood that the features and principles of the present invention may be implemented in a variety of other embodiments and the specific embodiments as illustrated in the Figures should in no way be construed as limiting the scope of the invention.

Referring to FIG. 6A, a flow chart illustrating the process steps for the fabrication of a substrate, such as a semiconductor wafer or LCD panel, using tool 10 is illustrated. In step 100 the function and performance characteristics of the substrate are designed. In the next step 102, one or more pattern(s) are developed according with the previous step. In a related step 104 a "blank" substrate, such as a semiconductor wafer or glass panel, is made and prepared for processing. The substrate is then processed in step 106 at least partially using the photolithography tool 10 as described herein. In step 108, the substrate is made into a final device and then inspected in step 110. For example with a semiconductor wafer, the substrate is diced, tested and packaged into an integrated circuit.

Figure 6B:
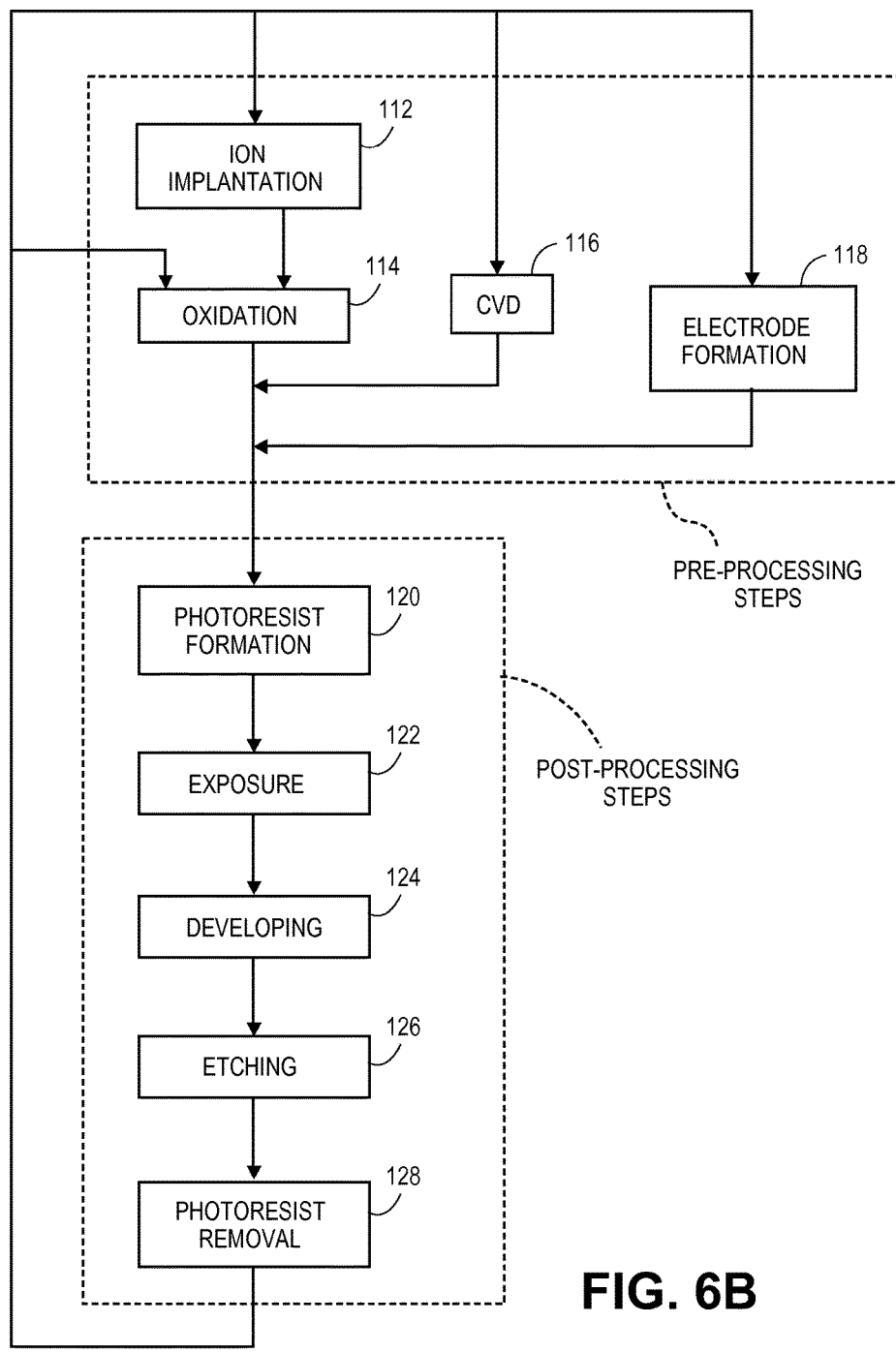

FIG. 6B illustrates a detailed flowchart example of the above-mentioned step 106 in the case of fabricating semiconductor devices. In step 112 (ion implantation step), ions are implanted in the wafer. In step 114 (oxidation step), the surface of the substrate is oxidized. In step 116 (CVD step), an insulation film is formed on the surface of the substrate. In step 118 (electrode formation step), electrodes are formed on the substrate by vapor deposition. The above-mentioned steps 112-118 form the preprocessing steps for wafer substrates during wafer processing, and selection is made at each step according to processing requirements.

At each stage of wafer processing, when the above-mentioned preprocessing steps have been completed, the following post-processing steps are typically implemented. During post-processing, first, in step 120 (photoresist formation step), photoresist is applied to the wafer substrate.

Next, in step 122 (exposure step), the lithography tool 10 as described herein is used to transfer the pattern defined by the reticle 26 onto the wafer substrate. Then in step 124 (developing step), the exposed wafer substrate is developed, and in step 126 (etching step), parts other than residual photoresist (exposed material surface) are removed by etching. In step 128 (photoresist removal step), unnecessary photoresist remaining after etching is removed. Multiple circuit patterns are formed by repetition of these preprocessing and post-processing steps. Although not described herein, the fabrication of LCD panels from glass substrates is performed in a somewhat similar manner as is well known in the art.

Although many of the components and processes are described above in the singular for convenience, it will be appreciated by one of skill in the art that multiple components and repeated processes can also be used to practice the techniques of the system and method described herein. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the invention may be employed with a variety of components and should not be restricted to the ones mentioned above. It is therefore intended that the invention be interpreted to include all variations and equivalents that fall within the true spirit and scope of the invention.

What is claimed is:

1. A method for supporting a reticle, the reticle including a plane surface, the method comprising the steps of:
    supporting the reticle with a reticle stage, the reticle stage including a first stage body, a second stage body and a flexure that is coupled to and extends between the first stage body and the second stage body;
    clamping the reticle to the reticle stage with (i) a first clamping element that is coupled to the first stage body, the first clamping element contacting the plane surface of the reticle, and (ii) a second clamping element that is coupled to the second stage body, the second clamping element contacting the plane surface of the reticle; and
    moving the first stage body relative to the second stage body in at least one degree of freedom to impart a bending moment to the reticle, the bending moment generated by applying a force with the clamping elements that engages and contacts the plane surface of the reticle to bend the reticle, the force being applied along the plane surface of the reticle.

2. The method of claim 1 wherein the step of supporting includes the first stage body being spaced apart from the second stage body.

3. The method of claim 1 wherein the step of supporting includes the reticle stage further including a first flexible element that is attached to the first stage body, and a second flexible element that is attached to the second stage body.

4. The method of claim 3 wherein the step of clamping includes the first clamping element being coupled to and extending between the first flexible element and the reticle, and the second clamping element being coupled to and extending between the second flexible element and the reticle.

5. The method of claim 1 wherein the step of moving includes moving the first stage body relative to the second stage body in the at least one degree of freedom with at least one motor.

6. The method of claim 5 wherein the step of moving includes moving the first stage body relative to the second stage body in multiple degrees of freedom with the at least one motor.

7. The method of claim 5 wherein the step of moving includes moving the first stage body relative to the second stage body in six degrees of freedom with the at least one motor.

8. The method of claim 1 wherein the step of moving includes the force applied along the plane surface of the reticle being dynamically applied during scanning of the reticle to create a localized bending of the reticle adjacent a stationary projection slit.

9. The method of claim 8 wherein the step of moving includes the force applied along the plane surface of the reticle creating one of an upward bending and a downward bending of the reticle adjacent the stationary projection slit.

10. The method of claim 1 wherein the step of clamping includes the first clamping element including a first blade-chuck, and the second clamping element including a second blade-chuck.

11. The method of claim 10 further comprising the step of generating a vacuum in the vicinity of the first blade-chuck and the second blade-chuck; and wherein the step of clamping includes clamping a first side of the reticle to the first blade-chuck and clamping a second side of the reticle to the second blade-chuck using the vacuum in the vicinity of the first blade-chuck and the second blade-chuck.

12. The method of claim 1 wherein the step of moving includes the force applied along the plane surface of the reticle being applied during acceleration of the reticle stage to prevent or reduce slippage of the reticle clamped to the reticle stage during the acceleration.

13. The method of claim 1 further comprising the steps of (i) generating an image distortion model for a lithography tool which compensates for image distortion introduced by the reticle and a projection lens assembly; (ii) dynamically applying the force along the plane surface of the reticle during a scan, in accordance with the image distortion model, for bending the reticle in a deterministic manner during the scanning; and (iii) projecting an image, defined by the reticle bent in the deterministic manner, onto a substrate during the scan.

14. The method of claim 13 further comprising the step of updating the image distortion model.

15. A method for supporting a reticle, the reticle including a plane surface, the method comprising the steps of:
supporting the reticle with a reticle stage, the reticle stage including (i) a first stage body, (ii) a second stage body, (iii) a first flexible element that is attached to the first stage body, (iv) a second flexible element that is attached to the second stage body, and (v) a flexure that is coupled to and extends between the first stage body and the second stage body;
clamping the reticle to the reticle stage with (i) a first clamping element that is coupled to and extends between the first flexible element and the reticle, the first clamping element contacting the plane surface of the reticle, and (ii) a second clamping element that is coupled to and extends between the second flexible element and the reticle, the second clamping element contacting the plane surface of the reticle; and
moving the first stage body relative to the second stage body in at least one degree of freedom with at least one motor to impart a bending moment to the reticle, the bending moment generated by applying a force with the clamping elements that engages and contacts the plane surface of the reticle to bend the reticle, the force being applied along the plane surface of the reticle.

16. The method of claim 15 wherein the step of moving includes moving the first stage body relative to the second stage body in multiple degrees of freedom with the at least one motor.

17. The method of claim 15 wherein the step of moving includes moving the first stage body relative to the second stage body in six degrees of freedom with the at least one motor.

18. The method of claim 15 wherein the step of clamping includes the first clamping element including a first blade-chuck, and the second clamping element including a second blade-chuck.

19. The method of claim 18 further comprising the step of generating a vacuum in the vicinity of the first blade-chuck and the second blade-chuck; and wherein the step of clamping includes clamping a first side of the reticle to the first blade-chuck and clamping a second side of the reticle to the second blade-chuck using the vacuum in the vicinity of the first blade-chuck and the second blade-chuck.

20. The method of claim 15 further comprising the steps of (i) generating an image distortion model for a lithography tool which compensates for image distortion introduced by the reticle and a projection lens assembly; (ii) dynamically applying the force along the plane surface of the reticle during a scan, in accordance with the image distortion model, for bending the reticle in a deterministic manner during the scanning; and (iii) projecting an image, defined by the reticle bent in the deterministic manner, onto a substrate during the scan.

21. The method of claim 20 further comprising the step of updating the image distortion model.

22. A method for supporting a reticle, the reticle including a plane surface, the method comprising the steps of:
supporting the reticle with a reticle stage, the reticle stage including a first stage body, a second stage body, a first flexible element that is attached to the first stage body, and a second flexible element that is attached to the second stage body;
clamping the reticle to the reticle stage with (i) a first clamping element that is coupled to the first stage body, the first clamping element contacting the plane surface of the reticle, the first clamping element being directly coupled to and extending between the first flexible element and the reticle, and (ii) a second clamping element that is coupled to the second stage body, the second clamping element contacting the plane surface of the reticle, the second clamping element being directly coupled to and extending between the second flexible element and the reticle; and
moving the first stage body relative to the second stage body in at least one degree of freedom to impart a bending moment to the reticle, the bending moment generated by applying a force with the clamping elements that engages and contacts the plane surface of the reticle to bend the reticle relative to at least one of the first stage body and the second stage body, the force being applied along the plane surface of the reticle.

23. An assembly for supporting a reticle, the reticle including a plane surface, the assembly comprising:
a reticle stage that supports the reticle, the reticle stage including a first stage body, a second stage body and a flexure that is coupled to and extends between the first stage body and the second stage body;
a first clamping element that is coupled to the first stage body, the first clamping element clamping the reticle to the reticle stage, the first clamping element contacting the plane surface of the reticle;
a second clamping element that is coupled to the second stage body, the second clamping element clamping the reticle to the reticle stage, the second clamping element contacting the plane surface of the reticle; and
at least one motor that moves the first stage body relative to the second stage body in at least one degree of freedom to impart a bending moment to the reticle, the bending moment generated by applying a force with the clamping elements that engages and contacts the plane surface of the reticle to bend the reticle, the force being applied along the plane surface of the reticle.

24. The assembly of claim 23 wherein the first stage body is spaced apart from the second stage body.

25. The assembly of claim 23 wherein the reticle stage further includes (i) a first flexible element that is attached to the first stage body, the first clamping element being coupled to and extending between the first flexible element and the reticle; and (ii) a second flexible element that is attached to the second stage body, the second clamping element being coupled to and extending between the second flexible element and the reticle.

26. The assembly of claim 23 wherein the clamping elements dynamically apply the force along the surface of the reticle during scanning of the reticle to create a localized bending of the reticle adjacent a stationary projection slit.

27. The assembly of claim 26 wherein the force applied along the surface of the reticle creates one of an upward bending and a downward bending of the reticle adjacent the stationary projection slit.

28. The assembly of claim 23 wherein the first clamping element includes a first blade-chuck, and wherein the second clamping element includes a second blade-chuck.

29. The assembly of claim 28 further comprising a first vacuum seal that is provided around the first blade-chuck to generate a first vacuum in the vicinity of the first blade-chuck, and a second vacuum seal that is provided around the second blade-chuck to generate a second vacuum in the vicinity of the second-blade-chuck; wherein the first clamping element clamps a first side of the reticle to the first blade-chuck using the first vacuum in the vicinity of the first blade-chuck; and wherein the second clamping element clamps a second side of the reticle to the second blade-chuck using the second vacuum in the vicinity of the second blade-chuck.

30. The assembly of claim 23 wherein the clamping elements apply the force along the surface of the reticle during acceleration of the reticle stage to prevent or reduce slippage of the reticle clamped to the reticle stage during the acceleration.

* * * * *